US009876081B2

(12) United States Patent
Meyer et al.

(10) Patent No.: US 9,876,081 B2
(45) Date of Patent: Jan. 23, 2018

(54) LIFT-OFF OF EPITAXIAL LAYERS FROM SILICON CARBIDE OR COMPOUND SEMICONDUCTOR SUBSTRATES

(71) Applicants: David J. Meyer, Fairfax, VA (US); Brian P. Downey, Alexandria, VA (US)

(72) Inventors: David J. Meyer, Fairfax, VA (US); Brian P. Downey, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 118 days.

(21) Appl. No.: 14/331,440

(22) Filed: Jul. 15, 2014

(65) Prior Publication Data
US 2015/0021624 A1 Jan. 22, 2015

Related U.S. Application Data

(60) Provisional application No. 61/846,687, filed on Jul. 16, 2013.

(51) Int. Cl.
H01L 21/306 (2006.01)
H01L 29/20 (2006.01)
(Continued)

(52) U.S. Cl.
CPC .... H01L 29/1608 (2013.01); H01L 21/32134 (2013.01); H01L 21/32135 (2013.01); H01L 21/6835 (2013.01); H01L 21/76256 (2013.01); H01L 21/7806 (2013.01); H01L 21/7813 (2013.01); H01L 29/2003 (2013.01); H01L 2221/68368 (2013.01); H01L 2924/0002 (2013.01)

(58) Field of Classification Search
CPC ....... H01L 21/306; H01L 29/20; H01L 29/16; H01L 21/762
USPC .......................................................... 438/77
See application file for complete search history.

(56) References Cited

U.S. PATENT DOCUMENTS 5,374,564 A 12/1994 Bruel
6,420,242 B1 7/2002 Cheung et al.
(Continued)

OTHER PUBLICATIONS

Bai et al., "Fabrication of GaAs-on-Insulator via Low Temperature Wafer Bonding and Sacrificial Etching of Ge by XeF2," Journal of the Electrochemical Society, 159 (2), H183-H190 (2012).
Cole et al., "Free-standing AlxGa1-xAs heterostructures by gas-phase etching of germanium," Applied Physics Letters, 96, 261102 (2010).
(Continued)

Primary Examiner — Fernando L Toledo
Assistant Examiner — Lawrence-Linh T Nguyen
(74) Attorney, Agent, or Firm — US Naval Research Laboratory; Dawn C. Russell

(57) ABSTRACT

A method to remove epitaxial semiconductor layers from a substrate by growing an epitaxial sacrificial layer on the substrate where the sacrificial layer is a transition metal nitride (TMN) or a TMN ternary compound, growing one or more epitaxial device layers on the sacrificial layer, and separating the device layers from the substrate by etching the sacrificial layer to completely remove the sacrificial layer without damaging or consuming the substrate or any device layer. Also disclosed are the related semiconductor materials made by this method.

38 Claims, 6 Drawing Sheets

(51) Int. Cl.
    *H01L 29/16*     (2006.01)
    *H01L 21/762*     (2006.01)
    *H01L 21/78*     (2006.01)
    *H01L 21/3213*     (2006.01)
    *H01L 21/683*     (2006.01)

(56) References Cited

U.S. PATENT DOCUMENTS

| | | |
|---|---|---|
| 7,262,113 B2 | 8/2007 | Ghyselen et al. |
| 7,422,983 B2 | 9/2008 | Cotte et al. |
| 7,825,006 B2 | 11/2010 | Nakamura et al. |
| 7,968,909 B2 | 6/2011 | Dupont |
| 2004/0209390 A1* | 10/2004 | Senda ............... C23C 4/02 438/46 |
| 2006/0234486 A1 | 10/2006 | Speck et al. |
| 2006/0255341 A1* | 11/2006 | Pinnington ......... B82Y 20/00 257/79 |
| 2007/0210320 A1* | 9/2007 | Ikemoto ............ H01L 33/0079 257/79 |
| 2012/0309172 A1 | 12/2012 | Romano et al. |
| 2014/0151763 A1* | 6/2014 | Hung et al. ............. 257/288 |
| 2014/0264384 A1* | 9/2014 | Loboda ............ H01L 21/02529 257/77 |

OTHER PUBLICATIONS

Ibbotson et al., "Selective interhalogen etching of tantalum compounds and other semiconductor materials," Applied Physics Letters 46 (8), 794 (1985).

\* cited by examiner

LIFT-OFF OF EPITAXIAL LAYERS FROM SILICON CARBIDE OR COMPOUND SEMICONDUCTOR SUBSTRATES

PRIORITY CLAIM

The present application is a non-provisional application claiming the benefit of U.S. Provisional Application No. 61/846,687, filed on Jul. 16, 2013 by David J. Meyer et al., entitled "Lift-Off of Epitaxial Layers from silicon carbide or compound semiconductor substrates," the entire contents of which is incorporated herein by reference.

BACKGROUND OF THE INVENTION

Field of the Invention

The present invention relates to separating a semiconductor layer from a substrate.

Description of the Prior Art

SiC substrates are commonly used for the high quality growth of semiconductor materials such as the homoepitaxial growth of SiC or heteroepitaxial growth of Group III-Nitrides (III-Ns) including gallium nitride (GaN), aluminum nitride (AlN), indium nitride (InN), and their various alloys for electronic or optoelectronic applications. Although SiC substrates offer advantages such as close lattice matching to the III-N material system for high quality epitaxial layer growth and excellent thermal conductivity for heat dissipation for power electronics, SiC substrates are relatively expensive. Therefore, it would be advantageous if a single SiC substrate could be reused for multiple semiconductor device layer growths. This could be accomplished by removing the grown semiconductor layers from the SiC substrate without damaging the SiC substrate or device layers and transferring them to a potentially less expensive substrate. Additionally, whereas SiC substrates may provide a suitable vehicle for semiconductor growth, separation of the semiconductor device layers from the SiC may be advantageous in certain applications, such as in III-N-based light emitting diodes (LEDs) where they typically destructively polish away SiC to extract light out of the bottom of the LED heterostructure.

Various methods have been reported to separate a semiconductor layer(s) from a substrate. A common separation technique is referred to as Smart Cut (U.S. Pat. No. 5,374, 564). The Smart Cut process involves implanting ions (e.g. $H^+$) into a donor substrate to create an abrupt, vertically localized, high concentration of ions at a targeted distance below the substrate surface forming a weakened layer. The surface of the donor substrate is usually capped with another material, such as a dielectric, prior to ion implantation to protect the surface. After ion implantation, the donor substrate is bonded to a carrier wafer and the two wafer system is heated to a temperature on the order of 400 to 600° C. The heating causes the implanted ions to coalesce and the original substrate to cleave parallel to the substrate surface along the weakened zone. Mechanical energy can be used instead of or in addition to thermal energy to split the substrate. After separation, the carrier wafer now possesses the thin top portion of the original substrate and that thin film can be further processed to fabricate the desired device. The original substrate can be recycled for subsequent Smart Cut processing. While the Smart Cut process is primarily associated with fabricating silicon-on-insulator wafers, this process has extended to various other materials such as SiC (U.S. Pat. No. 7,262,113) and GaN (U.S. Pat. No. 7,968, 909).

There are various disadvantages of the Smart Cut method. After wafer splitting, the surface of both the remaining thin film on the carrier substrate and the donor substrate need to be polished to create a smooth, planar surface for subsequent processing, which adds additional processing steps. Part of the donor wafer is consumed for each Smart Cut process, limiting the lifetime of the donor wafer. The thickness of the transferred thin film is practically limited by the ion implantation equipment, typically to a few micrometers; this prevents the use of thicker films which may be desirable in certain applications. It may be advantageous to further process the thin film on the donor wafer prior to transferring it to the carrier wafer. Post ion implantation, processing the thin film on the donor wafer is limited by the thermal budget of the wafer splitting process, 400 to 600° C. This temperature range is below that needed for various semiconductor processing steps, such as ohmic contact annealing and dopant ion activation. The Smart Cut ion implantation step may cause damage to device layers if certain processing steps are done beforehand, such as gate oxide growth or deposition.

A method more specific to the separation of III-N materials from a substrate is the laser lift-off technique (U.S. Pat. No. 6,420,242). This process is used in the specific instance of a GaN layer grown on a sapphire substrate (other layers may be grown on top of the GaN, i.e. AlN). The sapphire substrate is irradiated with a laser at a wavelength that is transparent to the sapphire substrate but is absorbed by the GaN. The laser energy causes the GaN at the interface to decompose into Ga-rich regions. Further heating above the melting point of Ga (30° C.) causes the III-N material and the sapphire substrate to debond. The III-N material may be bonded to a carrier substrate prior to laser irradiation. This process has several limitations, particularly the selection of the substrate used for III-N material growth. Laser lift-off requires that the substrate have a larger band gap than the III-N layer grown on top. For instance while higher quality $Al_xGa_{1-x}N$ films, where $0 \le x \le 1$, can be grown on SiC compared to sapphire due to smaller lattice mismatch, the $Al_xGa_{1-x}N$ films cannot be removed from the SiC substrate by laser lift-off due to the lower band gap of SiC. Most commercial GaN RF products use SiC substrates.

A sacrificial layer has also been used to separate III-N materials from a SiC substrate. In one process a smaller band gap material than the SiC substrate or other III-N epitaxial layers is grown first on the SiC as the sacrificial layer (U.S. Pat. No. 7,825,006). The sacrificial layer is removed using the aforementioned laser lift-off or photoelectrochemical (PEC) etching. In either case the design of the epilayer device structure is limited by the sacrificial layer, which must have the smallest band gap.

There are other known methods that combine ideas from the above. One is combining a sacrificial layer with the Smart Cut process to avoid consumption of the donor substrate (U.S. Patent Publication US2012/0309172). Another is ion implanting the substrate prior to growth to create a weakened zone, so that the grown layers and top of substrate fracture along the weakened zone after the growth process (U.S. Patent Publication US2006/0234486). These processes suffer similar limitations to those described above for the Smart Cut process.

BRIEF SUMMARY OF THE INVENTION

The aforementioned problems are overcome in the present invention which provides a method to remove epitaxial semiconductor layers from a substrate by growing an epitaxial sacrificial layer on the substrate where the sacrificial layer is a transition metal nitride (TMN) or a TMN ternary compound, growing one or more epitaxial device layers on the sacrificial layer, and separating the device layers from the substrate by etching the sacrificial layer to completely remove the sacrificial layer without damaging or consuming the substrate or any device layer. Also disclosed are the related semiconductor materials that can be made by this method.

The purpose of this invention is to enable a new process to remove or lift-off epitaxially grown metal, semiconductor, and/or insulator layers from a silicon carbide (SiC) substrate using an intermediate, sacrificial epitaxial lift-off layer, allowing the SiC substrate to be reused for subsequent epitaxial growths. The epitaxially grown layers may then be transferred to any foreign substrate with properties that may enhance the intended application of the epitaxial layers or devices contained on them. Such properties may include increased substrate mechanical stability or flexibility, or improved thermal conductivity. The intermediate lift-off layer may be etched via dry or wet etching mechanisms. This method provides a means to reuse the SiC substrate for epitaxial growth and the flexibility to transfer the epitaxial grown layers to any desired foreign substrate.

There are several advantages of this invention over other methods. One advantage is that the $Ta_2N$ sacrificial layer is completely removed by the $XeF_2$ etching without damaging the SiC substrate or grown device layer(s). By leaving the SiC substrate undamaged, only minor chemical cleaning is required to obtain an adequate SiC surface for subsequent growths, allowing the SiC substrate to be used indefinitely. The device layer surface in contact with the $Ta_2N$ layer also remains undamaged and should only require minimal cleaning prior to further processing. This is an advantage over ion implantation wafer separation techniques where both sides of the weakened zone require polishing before further processing. Additionally, part of the substrate is typically consumed for ion implantation techniques, limiting the number of times a substrate can be recycled.

A second advantage is the thermodynamic stability between the $Ta_2N$ sacrificial layer and the SiC substrate and device layer(s). This allows for the device layer(s) to be processed prior to wafer separation with a large thermal budget. If ion implantation were used for wafer separation, the thermal budget of subsequent processing steps would be limited to the temperature used for wafer separation (400 to 600° C.), which is lower than some processing steps such as ohmic contact annealing or dopant activation.

Additionally, if the ion implantation step used for wafer separation were performed after some device processing steps, there would be potential for damage from the ion implantation step, for example in gate dielectrics. The present invention allows for greater processing flexibility.

A third advantage is that any materials added to the device layer(s) during device processing steps that may etch in the presence of $XeF_2$ gas, such as some metals, can be protected from $XeF_2$ exposure by simply using a protective layer, such as photoresist. If the device layer(s) are bonded to a carrier substrate then no protective layer would be necessary.

A fourth advantage is that the $XeF_2$ etching process is performed at lower temperatures than the wafer splitting process for the ion implantation methods. $XeF_2$ etching can be performed at room temperature so wafer separation can occur after device processing steps that have been completed have a low thermal budget. This prevents device performance degradation due to high temperature exposure.

A fifth advantage is that the band gaps of the semiconductor device layers are not limited as in the laser lift-off process or PEC chemical processes. Any material that would be grown on SiC could be grown on the $Ta_2N$ sacrificial layer with similar quality due to the similar crystal structure and in-plane lattice constants.

These and other features and advantages of the invention, as well as the invention itself, will become better understood by reference to the following detailed description, appended claims, and accompanying drawings.

DETAILED DESCRIPTION OF THE INVENTION

Figure 1:
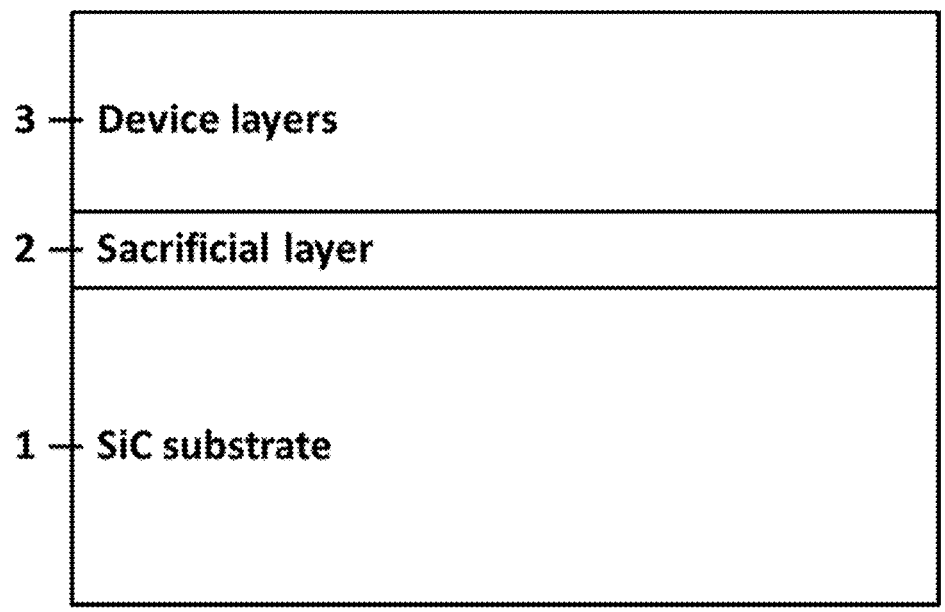
FIG. 1 is a schematic of a SiC substrate with grown sacrificial and device layers.

The present invention provides a process to remove epitaxially grown metal, semiconductor and/or insulator layers from a SiC substrate using an intermediate, sacrificial epitaxial layer. A preferred embodiment of this invention involves growing an epitaxial sacrificial layer 2 on the SiC substrate 1 prior to growing the remainder of the epitaxial device layers 3 as shown in FIG. 1. The SiC substrate should have a hexagonal crystal structure, consisting of either the 4H or 6H polytype. The sacrificial layer 2 should have a similar crystal structure and in-plane lattice constant, a, to SiC allowing for epitaxial growth of the sacrificial layer 2 on the SiC substrate 1. The sacrificial layer 2 should also be easily removed by selective etching compared to the SiC substrate 1 and any device layers 3 grown on top. The sacrificial layer 2 that has been experimentally demonstrated in our lab was tantalum nitride ($Ta_2N$), but could also be other transition metal nitrides (TMN) such as $TaN_x$, $NbN_x$, $WN_x$, or $MoN_x$, where x>0, or any TMN ternary compound. The $Ta_2N$ was grown by electron beam evaporation molecular beam epitaxy. Both $Ta_2N$ and SiC have hexagonal crystal structures and similar in-plane lattice constants, where $a_{SiC}$=3.073 Å and $a_{Ta2N}$=3.041 Å, allowing the $Ta_2N$ film 2 to be grown epitaxially oriented to the SiC substrate 1 in single crystal form with low defect density. The $Ta_2N$ sacrificial layer 2 acts as a template for subsequent device layer growth 3. Any material layers grown on SiC can be grown on $Ta_2N$ with comparable quality due to the similar lattice constants and hexagonal crystal structure of the SiC substrate 1 and $Ta_2N$ or other TMN 2. Additionally, thermodynamic stability is maintained between the $Ta_2N$ 2, SiC substrate 1, and the device layer(s) 3 due to the high melting point of $Ta_2N$ (>2000° C.), well above the growth temperature of most commonly-used growth methods, such as molecular beam epitaxy (MBE), metal organic chemical vapor deposition, atomic layer epitaxy, sputtering, etc.

While the $Ta_2N$ sacrificial layer 2 can be grown by a variety of known methods, in a preferred embodiment the $Ta_2N$ 2 is grown immediately prior to the subsequently grown device layers 3 to prevent surface contamination or oxidation. For example, if the device layers 3 were grown via MBE, it would be preferred to grow the $Ta_2N$ in the same growth chamber. This could be accomplished by using an electron-beam evaporated Ta source and nitrogen plasma. Prior to $Ta_2N$ 2 growth, the SiC substrate 1 should receive typical cleaning and pretreatment steps. The device layer(s) 3 are not limited to any particular material system; however, this technique would be aptly suited for growth of epitaxial device structures using the III-N material system, which are commonly grown on SiC substrates.

Figure 2:
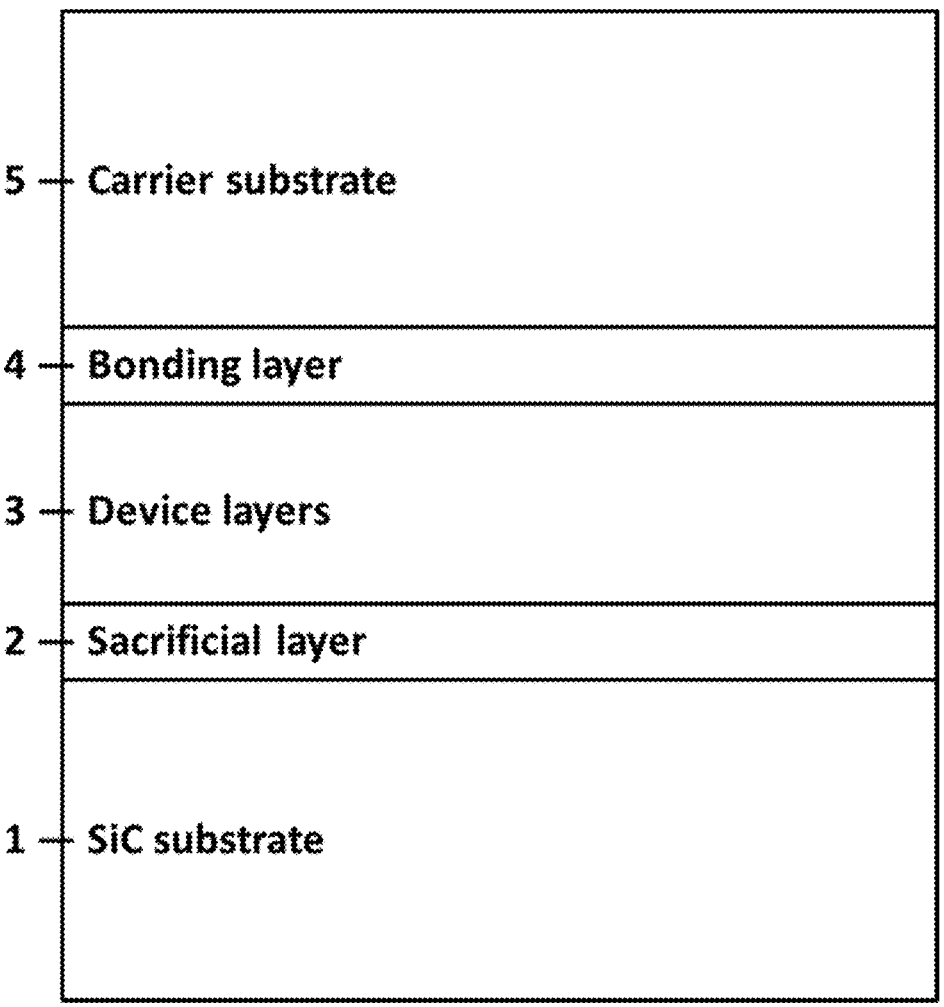
FIG. 2 is a schematic of a SiC substrate with grown sacrificial and device layers bonded to a carrier substrate with a bonding layer.
Figure 3:
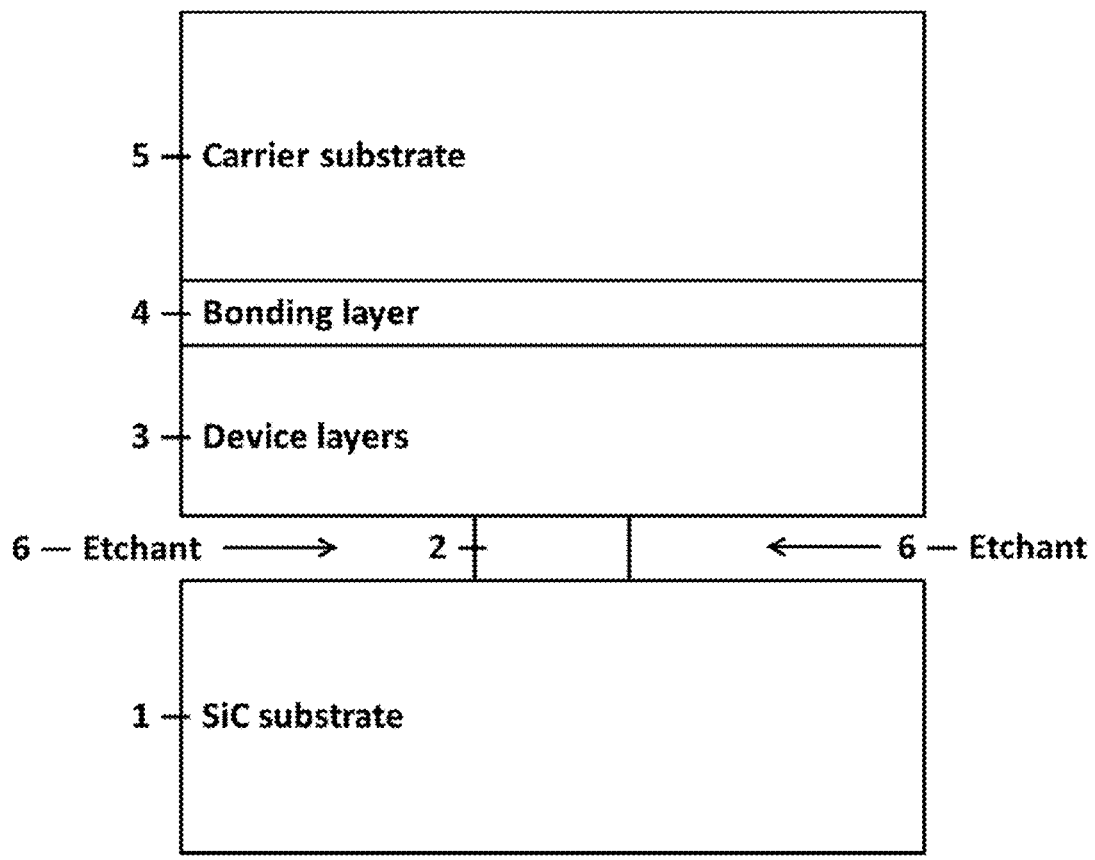
FIG. 3 shows removal of a $Ta_2N$ sacrificial layer by selective etchant.
Figure 4:
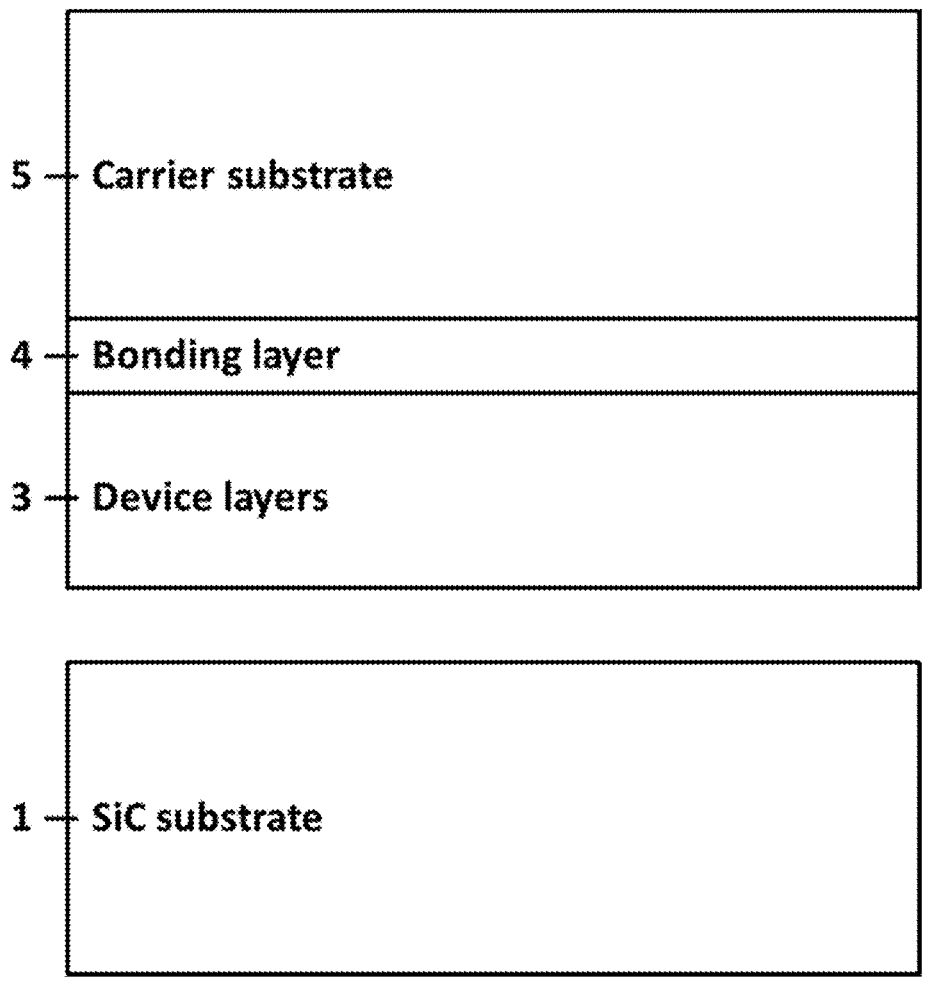
FIG. 4 shows a SiC substrate separated from device layers on a carrier substrate.

There are many optional steps after the device layer(s) 3 are grown. The device layer(s) 3 may be separated from the SiC substrate 1 by selectively etching the $Ta_2N$ sacrificial layer 2. Optionally the composite structure may be bonded to a carrier substrate 5 using a bonding layer 4 by any known wafer bonding technique as shown in FIG. 2. The bonding layer 4 and carrier substrate 5 would have properties (i.e. electrical or mechanical) advantageous to the device layer(s) 3 application. The $Ta_2N$ layer 2 can then be removed by a selective etchant 6 as shown in FIG. 3. The selective etchant 6 should remove the $Ta_2N$ 2 rapidly without reacting with any of the other layers 1, 3, 4, and 5. The selective etchant 6 used in a preferred embodiment is xenon difluoride ($XeF_2$) gas, commonly used in selective etching of silicon (Si) for microelectromechanical systems (MEMS) processing. $XeF_2$ gas has been used to selectively etch tantalum (Ta) and tantalum nitride (TaN) for copper (Cu) interconnect processing (U.S. Pat. No. 7,422,983). $XeF_2$ has also been used to etch a sacrificial layer of germanium (Ge) for gallium arsenide (GaAs)-on-insulator wafers (Y. Bai et al., "Fabrication of GaAs-on-insulator via low temperature wafer bonding and sacrificial etching of Ge by $XeF_2$," *Journal of the Electrochemical Society* 159 (2), H183 (2012)) and free-standing $Al_xGa_{1-x}As$ heterostructures (G. D. Cole et al., "Free-standing $Al_xGa_{1-x}As$ heterostructures by gas-phase etching of germanium," *Applied Physics Letters* 96, 261102 (2010)). $XeF_2$ gas is not known to attack SiC or III-N materials. The bonding layer 4 and carrier substrate 5 materials would need to be resistant to the $XeF_2$ etchant or potentially coated with a protective layer. The $XeF_2$ etching 6 of the sacrificial layer 2 can be performed in a $XeF_2$ etching system such as the Xetch system produced by Xactix, Inc., where $XeF_2$ gas can be flowed into a vacuum chamber at a known pressure. The etching may be performed under continuous $XeF_2$ flow or by alternating the $XeF_2$ flow and pumping out the etch chamber for a set time and number of cycles (termed pulse mode). An inert gas, such as nitrogen ($N_2$) may be flowed along with the $XeF_2$ gas. The etch rate of the $Ta_2N$ 2 may be tailored by adjusting the pressure of the $XeF_2$ gas and the temperature of the substrate. The etching continues until the $Ta_2N$ 2 is fully consumed and the SiC substrate 1 is separated from the device layer(s) 3 as shown in FIG. 4.

Figure 5:
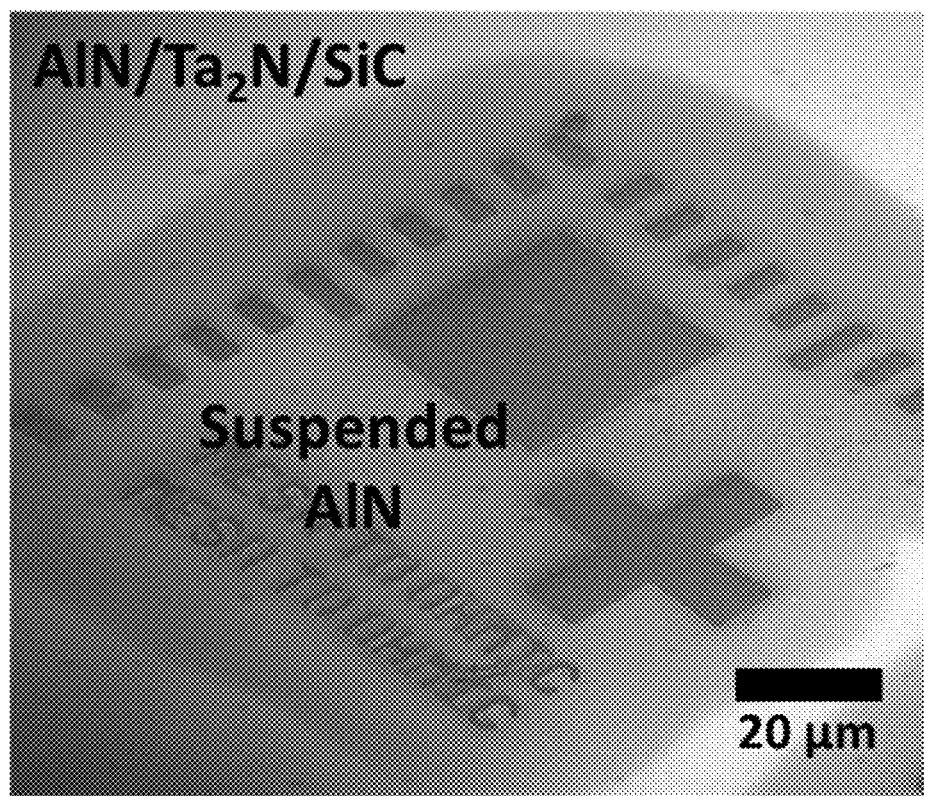
FIG. 5 is a SEM micrograph of suspended AlN layer on SiC substrate created by selective etching of $Ta_2N$ by $XeF_2$.
Figure 6:
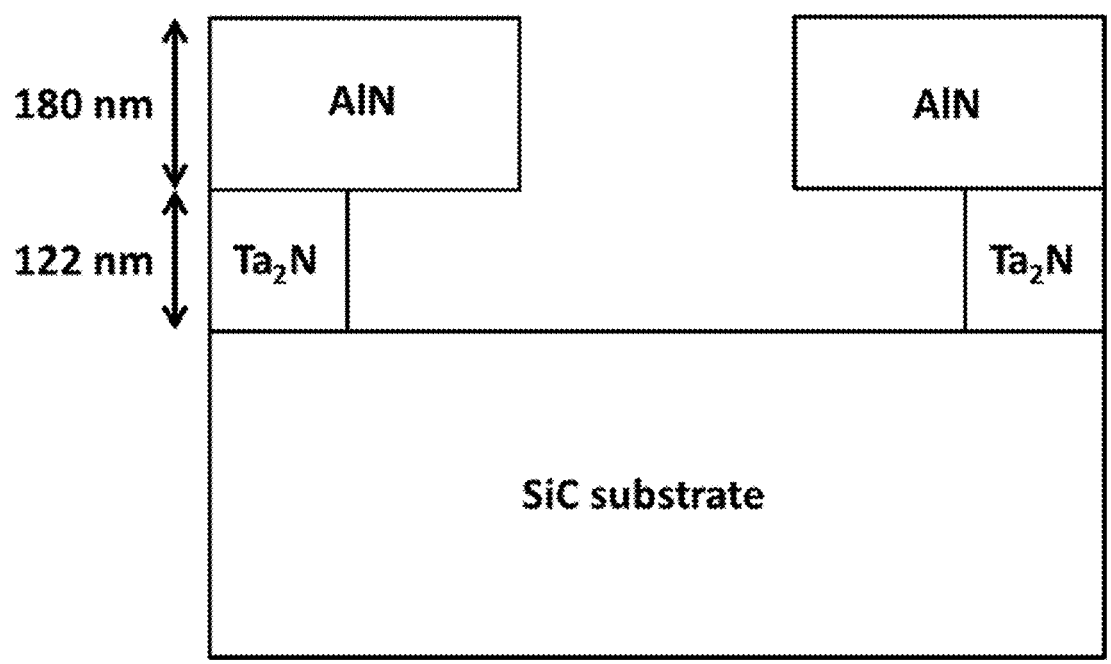
FIG. 6 is a side-view schematic of the AlN/$Ta_2N$/SiC structure in FIG. 5 after $XeF_2$ etching the $Ta_2N$ layer to create suspended AlN film.

Experimental observation of using $XeF_2$ gas to selectively etch $Ta_2N$ grown on a SiC substrate is shown in the scanning electron microscope (SEM) micrograph in FIG. 5 where a 122 nm $Ta_2N$ layer was grown on a 6H SiC substrate followed by a 180 nm AlN layer. The AlN layer was patterned using conventional optical photolithography and the AlN and $Ta_2N$ layers were etched down to the SiC substrate using a chlorine-based plasma. The photoresist mask was removed using solvents and the sample was subjected to a mixture of $XeF_2$ and $N_2$ gas, which etched the $Ta_2N$ undercutting the AlN layer, as shown in FIG. 6. There was no visible damage to the SiC substrate or the AlN layer.

Figure 7:
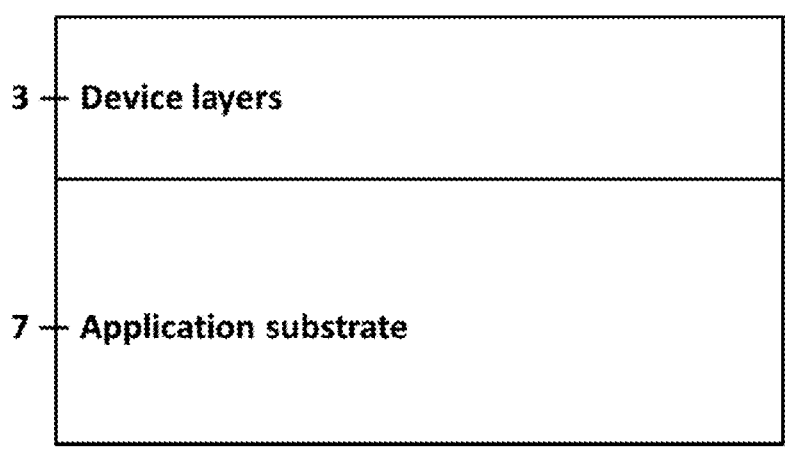
FIG. 7 is a schematic showing device layers bonded to a final substrate.

After separation, the SiC substrate 1 may be recycled for subsequent growth following the process described above. As the $XeF_2$ gas should completely remove the $Ta_2N$ layer, the SiC substrate should not require extensive cleaning and polishing prior to growing new layers. The separated device layer(s) 3, bonding layer 4, and carrier substrate 5 may be further processed to form the desired devices. The device layer(s) 3 may be debonded from the carrier substrate 5 and bonded to another substrate that enhances the intended application of the device 7, as shown in FIG. 7, as required by the fabrication process. For instance, the device layer(s) 3 may need to be transferred to a different substrate 7 so that the surface originally exposed after the device layer(s) growth and was in contact with the bonding layer 4 is again exposed.

The separation of the device layer(s) 3 and the SiC substrate 1 via $XeF_2$ etching may occur after the device layer(s) 3 have begun to be processed to fabricate the desired devices. Fabrication may include such steps as further device layer growth, mesa etching, ohmic contact formation, ohmic contact annealing, gate dielectric deposition, gate metallization, passivation, etc. Any materials added to the device layer(s) 3, i.e. metals or insulators, during processing must also be resistant to $XeF_2$ etching or a protective surface layer must be added prior to wafer separation that is resistant to $XeF_2$ etching, such as photoresist. Depending on the thickness of the device layer(s) 3, no carrier wafer may be required for separation via $XeF_2$ etching 6 from the SiC substrate 1.

There are a number of variations in the above invention. An alternative sacrificial layer to $Ta_2N$ is niobium nitride ($Nb_2N$), which has a hexagonal crystal structure and similar in-plane lattice constant, $a_{Nb2N}$=3.055 Å. The melting point of $Nb_2N$ is also high (>2000° C.), and provides similar thermal stability as $Ta_2N$. $Nb_2N$ also etches in $XeF_2$. Potential sacrificial layers may also include other TMN such as $TaN_x$, $NbN_x$, $WN_x$, or $MoN_x$ or any TMN ternary compound.

While $XeF_2$ gas was used above, other gases and wet chemical etches may also provide adequate speed and selectivity when etching the sacrificial layer. For instance $ClF_3$ gas has been shown to etch $Ta_2N$ (D. E. Ibbotson et al., "Selective interhalogen etching of tantalum compounds and other semiconductor materials," *Applied Physics Letters*, 46, 794 (1985)). Wet etch mixtures may include hydrofluoric acid, nitric acid, hydrochloric acid, or others.

The device layers grown on top of the sacrificial layer are not limited to III-N materials or even single crystal materials for epitaxial growth. Any material(s) can be grown on the sacrificial layer as long as the deposited material(s) are in thermodynamic equilibrium with the sacrificial layer at the growth temperature, and a suitable etchant for the sacrificial layer can be found which does not attack the SiC substrate or deposited material(s). One or more device layer may comprise SiC.

The sacrificial layer may be deposited by any known growth method, such as sputtering or chemical vapor deposition. While depositing the sacrificial layer immediately prior to depositing the device layer(s) is best, the sacrificial layer may be deposited prior to loading the sample into the device layer growth chamber. Proper cleaning of the sacrificial layer will be required in this case to achieve a native oxide-free surface for device layer growth.

The sacrificial layer does not have to be deposited directly on the SiC substrate. Additional layers with similar crystal structure and lattice constant to the substrate and sacrificial layer, such as AlN, may be deposited on the SiC substrate prior to depositing the sacrificial layer.

Substrates other than SiC may also be used with aforementioned TMN sacrificial layer. Ideal substrates would have a similar crystal structure and lattice constant to the TMN sacrificial layer. Examples include, but are not limited to, AlN, GaN, Si(111), and sapphire substrates. The crystal structure of the substrate may have 3-fold symmetry.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method to remove epitaxial device layers from a substrate, comprising: growing an epitaxial sacrificial layer on the substrate, wherein the epitaxial sacrificial layer comprises a transition metal nitride (TMN) selected from the group consisting of $Ta_2N$, $Nb_2N$, $TaN_x$, $NbN_x$, $WN_x$, and $MoN_x$, where x>0, or a TMN ternary compound comprising a transition metal selected from the group consisting of Ta, Nb, W, and Mo; growing one or more epitaxial device layers directly on the epitaxial sacrificial layer, wherein the epitaxial sacrificial layer is grown immediately prior to the growing of the one or more epitaxial device layers; and separating the epitaxial device layers from the substrate by etching the epitaxial sacrificial layer to completely remove the epitaxial sacrificial layer without damaging or consuming the substrate or any epitaxial device layer.

2. The method of claim 1, wherein the substrate comprises SiC.

3. The method of claim 2, wherein the substrate has a hexagonal crystal structure, consisting of the 4H or 6H polytype.

4. The method of claim 1, wherein the substrate comprises AlN, GaN, Si (111), or sapphire.

5. The method of claim 4, wherein the crystal structure of the substrate has 3-fold symmetry.

6. The method of claim 1, wherein the etching is performed using $XeF_2$ gas.

7. The method of claim 1, wherein the etching is performed using a wet-chemical etchant.

8. The method of claim 7, wherein the wet-chemical etchant comprises hydrofluoric acid, nitric acid, or hydrochloric acid.

9. The method of claim 1, wherein the etching is continuous.

10. The method of claim 1, wherein the etching is pulsed.

11. The method of claim 1, wherein the one or more epitaxial layers comprise a Group III nitride or SiC.

12. The method of claim 1, additionally comprising bonding a carrier substrate to the epitaxial layers using a bonding layer.

13. A device made by the method comprising: growing an epitaxial sacrificial layer on a substrate, wherein the epitaxial sacrificial layer comprises a transition metal nitride (TMN) selected from the group consisting of $Ta_2N$, $Nb_2N$, $TaN_x$, $NbN_x$, $WN_x$, and $MoN_x$, where x>0, or a TMN ternary compound comprising a transition metal selected from the group consisting of Ta, Nb, W, and Mo; growing one or more epitaxial device layers directly on the epitaxial sacrificial layer, wherein the epitaxial sacrificial layer is either grown immediately prior to the growing of the one or more epitaxial device layers or cleaned prior to the growing of the one or more epitaxial device layers; and separating the epitaxial device layers from the substrate by etching the epitaxial sacrificial layer to completely remove the epitaxial sacrificial layer without damaging or consuming the substrate or any epitaxial device layer.

14. The device of claim 13, wherein the substrate comprises SiC.

15. The device of claim 14, substrate has a hexagonal crystal structure, consisting of the 4H or 6H polytype.

16. The device of claim 13, wherein the substrate comprises AlN, GaN, Si (111), or sapphire.

17. The device of claim 16, wherein the crystal structure of the substrate has 3-fold symmetry.

18. The device of claim 13, wherein the etching is performed using $XeF_2$ gas.

19. The device of claim 13, wherein the etching is performed using a wet-chemical etchant.

20. The device of claim 19, wherein the wet-chemical etchant comprises hydrofluoric acid, nitric acid, or hydrochloric acid.

21. The device of claim 13, wherein the etching is continuous.

22. The device of claim 13, wherein the etching is pulsed.

23. The device of claim 13, wherein the one or more epitaxial device layers comprise a Group III nitride or SiC.

24. The device of claim 13, additionally comprising bonding a carrier substrate to the epitaxial device layers using a bonding layer.

25. A method to remove epitaxial device layers from a substrate, comprising: growing an epitaxial sacrificial layer on the substrate, wherein the epitaxial sacrificial layer comprises a transition metal nitride (TMN) selected from the group consisting of $Ta_2N$, $Nb_2N$, $TaN_x$, $NbN_x$, $WN_x$, and $MoN_x$, where x>0, or a TMN ternary compound comprising a transition metal selected from the group consisting of Ta, Nb, W, and Mo; growing one or more epitaxial device layers directly on the epitaxial sacrificial layer, wherein if the epitaxial sacrificial layer is not grown immediately prior to the growing of the one or more epitaxial device layers, the epitaxial sacrificial layer is cleaned prior to the growing of the one or more epitaxial device layers; and separating the epitaxial device layers from the substrate by etching the epitaxial sacrificial layer to completely remove the epitaxial sacrificial layer without damaging or consuming the substrate or any epitaxial device layer.

26. The method of claim 25, wherein the substrate comprises SiC.

27. The method of claim 26, wherein the substrate has a hexagonal crystal structure, consisting of the 4H or 6H polytype.

28. The method of claim 25, wherein the substrate comprises AlN, GaN, Si (111), or sapphire.

29. The method of claim 28, wherein the crystal structure of the substrate has 3-fold symmetry.

30. The method of claim 25, wherein the etching is performed using $XeF_2$ gas.

31. The method of claim 25, wherein the etching is performed using a wet-chemical etchant.

32. The method of claim 31, wherein the wet-chemical etchant comprises hydrofluoric acid, nitric acid, or hydrochloric acid.

33. The method of claim 25, wherein the etching is continuous.

34. The method of claim 25, wherein the one or more epitaxial device layers comprise a Group III nitride or SiC.

35. The method of claim 25, additionally comprising bonding a carrier substrate to the epitaxial device layers using a bonding layer.

36. The method of claim 1, further comprising the step of reusing the substrate for subsequent epitaxial device layer growth.

37. The device of claim 13, wherein the substrate is reused for subsequent epitaxial device layer growth.

38. The method of claim 25, further comprising the step of reusing the substrate for subsequent epitaxial device layer growth.

* * * * *